United States Patent
Mancini et al.

(10) Patent No.: US 6,576,520 B2
(45) Date of Patent: Jun. 10, 2003

(54) AMORPHOUS CARBON LAYER FOR IMPROVED ADHESION OF PHOTORESIST AND METHOD OF FABRICATION

(75) Inventors: David P. Mancini, Fountain Hills, AZ (US); Steven M. Smith, Gilbert, AZ (US); Douglas J. Resnick, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 4 days.

(21) Appl. No.: 10/040,984

(22) Filed: Jan. 7, 2002

(65) Prior Publication Data

US 2002/0058383 A1 May 16, 2002

Related U.S. Application Data

(62) Division of application No. 09/703,208, filed on Oct. 31, 2000, now Pat. No. 6,368,924.

(51) Int. Cl.[7] .............................................. H01L 21/336
(52) U.S. Cl. ........................ 438/286; 438/206; 438/488; 438/758
(58) Field of Search ................................ 438/286, 206, 438/488, 758

(56) References Cited

U.S. PATENT DOCUMENTS

| | | | |
|---|---|---|---|
| 5,022,959 A | | 6/1991 | Itoh et al. |
| 5,470,661 A | * | 11/1995 | Bailey et al. ................ 428/408 |
| 5,733,713 A | | 3/1998 | Yano et al. |
| 5,830,332 A | * | 11/1998 | Babich et al. ......... 204/192.15 |
| 6,180,531 B1 | * | 1/2001 | Matsumoto et al. ........ 438/706 |
| 6,331,481 B1 | * | 12/2001 | Stamper et al. ............. 438/626 |
| 6,368,924 B1 | * | 4/2002 | Mancini et al. ............. 438/286 |

FOREIGN PATENT DOCUMENTS

| | | |
|---|---|---|
| EP | 0531232 | 3/1993 |
| JP | 08102014 | 4/1996 |

* cited by examiner

Primary Examiner—Michael S. Lebentritt
Assistant Examiner—Pho M. Luu
(74) Attorney, Agent, or Firm—William E. Koch

(57) ABSTRACT

An improved and novel semiconductor device including an amorphous carbon layer for improved adhesion of photoresist and method of fabrication. The device includes a substrate having a surface, a carbon layer, formed on the surface of the substrate, and a resist layer formed on a surface of the carbon layer. The device is formed by providing a substrate having a surface, depositing a carbon layer on the surface of the substrate using plasma enhanced chemical vapor deposition (PECVD) or sputtering, and forming a resist layer on a surface of the carbon layer.

10 Claims, 1 Drawing Sheet

AMORPHOUS CARBON LAYER FOR IMPROVED ADHESION OF PHOTORESIST AND METHOD OF FABRICATION

This application claims the benefit of provisional application Ser. No. 09/703,208 filed Oct. 31, 2000 now U.S. Pat. No. 6,368,924.

FIELD OF THE INVENTION

The present invention relates to semiconductor processing techniques, and more particularly to a semiconductor device including a photoresist layer having improved adhesion qualities and a method for fabricating the device including the enhancement of photoresist adhesion on a substrate material.

BACKGROUND OF THE INVENTION

Photoresist adhesion to substrates, in particular InGaAs and InAlAs substrates, is very poor using current methodology. The result is a reduction in the quality of photolithography processing. There have been several attempts to improve the adhesion of photoresist materials to the surface of various substrate materials, such as InGaAs and InAlAs. While many surface pretreatment options have been utilized, these conventional procedures have failed to have the adhesive durability required to complete all necessary processing steps. In particular, photoresist layers have been observed to peel away from wafer surfaces during development steps or during immersion in cleaning solutions such as an ammonium hydroxide ($NH_4OH$) solution (10% in water). This $NH_4OH$ solution is commonly used to clean the wafer surfaces prior to subsequent processing steps such as depositions and metallization.

Several attempts have been made recently with respect to surface pretreatment options to modify the wafer surfaces in an effort to promote resist adhesion. These options have included, dehydration bakes, application of both i-line and DUV anti-reflective coatings used as thin film interlayers, standard HMDS vapor priming, and the application of several silane based organic coupling agents. However, none of these processes has improved adhesion adequately.

The current industry standard is to vapor prime wafer surfaces with hexamethyldisilizane (HMDS). HMDS is used as a means of preparing silicon wafers for the resist coating. However, HMDS is only chemically compatible with silicon and does not react in the same manner with other materials. On a silicon surface, HMDS applies, from the vapor phase, an organic monolayer which is repellant to water or other aqueous solutions such as developers or $NH_4OH$. The water repellant nature of the film at the substrate/resist interface prevents the lifting of resist films during subsequent aqueous processing such as developing or cleaning. It is known that the contact angle of water on a surface is a good measure of water repellency of that surface. The contact angle of a water droplet on a properly HMDS primed silicon surface typically measures between 65–72°. It has additionally been found that traditional vapor priming lasts only three days until the wafers must be primed again. In addition, during the vapor priming process, wafers are typically brought to a temperature of 150° C. for a period exceeding 30 minutes. This is objectionable for certain temperature sensitive applications.

As previously stated, other methods exist to promote adhesion of photoresist to wafers. One such method, often used to modify surfaces which are inert to vapor priming, is to use a chemical vapor deposition (CVD) process to apply a thin (<500A) layer of a second material such as silicon nitride (SiN) or silicon oxide (SiO) to the surface. The deposition of this material when coupled with traditional HMDS vapor priming, provides for excellent adhesion of the resist layer to the wafer surface. However, such coatings must be later removed which can present additional problems. For example, it has been found that removal of the SiN material, generally through dry etching techniques, is very aggressive and can lead to damage of the fragile wafer epi layer.

Accordingly, it is an object of the present invention to provide for a semiconductor device that includes a surface pretreatment that promotes enhanced adhesion of a photoresist to a wafer surface.

It is another object of the present invention to provide for a semiconductor device that includes an interfacial material that promotes adhesion of a photoresist to a wafer surface.

It is still a further object of the present invention to provide for a semiconductor device that includes an enhanced photoresist adhesion in which subsequent removal of the resist and interfacial layer does not damage the underlying material surface.

It is yet another object of the present invention to provide for a method of fabricating a semiconductor device including the steps of providing for a surface pretreatment that promotes enhanced adhesion of a photoresist to a wafer surface.

It is still yet another object of the present invention to provide for a method of fabricating a semiconductor device including the steps of providing for an interfacial material that promotes enhanced adhesion of a photoresist material to a wafer surface.

SUMMARY OF THE INVENTION

These needs and others are substantially met through provision of a semiconductor device and a method of fabricating the semiconductor device including a substrate, a photoresist stack, and a carbon layer disposed between the substrate and the photoresist stack. The method of fabricating the semiconductor device includes the steps of providing a substrate having a surface, depositing a carbon layer on the surface of the substrate, and forming a resist stack on a surface of the carbon layer. The carbon layer is formed utilizing standard plasma enhanced chemical vapor deposition techniques (PECVD) or sputtering.

BRIEF DESCRIPTION OF THE DRAWINGS

The foregoing and further and more specific objects and advantages of the present invention will become readily apparent to those skilled in the art from the following detailed description of a preferred embodiment thereof taken in conjunction with the drawings, in which.

DETAILED DESCRIPTION OF THE PREFERRED EMBODIMENTS

Figure 1:
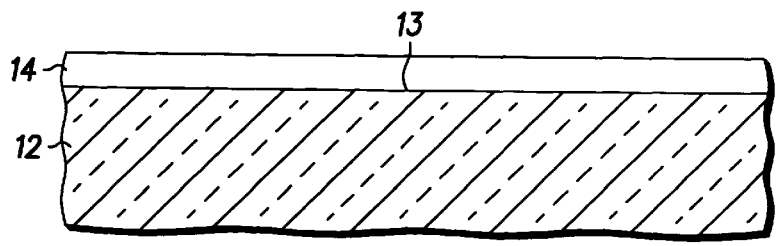
FIGS. 1–4 illustrate cross-sectional views of the steps in fabricating a semiconductor device including an amorphous carbon layer for improved adhesion of a photoresist according to the present invention.

During the course of this description, like numbers are used to identify like elements according to the different figures that illustrate the invention. Accordingly, FIG. 1 illustrates in simplified cross-sectional view a first step in the method of fabricating a semiconductor device according to the present invention. Illustrated in FIG. 1 is a semiconductor device, generally referenced 10, including as a first step the providing of a substrate 12. In this particular embodiment, substrate 12 is described as being formed of any III–V material. More specifically, substrate 12 is described as being formed of an InGaAs material. It should be understood, that anticipated by this disclosure is the fabrication of substrate 12 of an InAlAs material, a GaAs material, or any other materials which exhibit difficulty with photoresist adhesion, including but not limited to silicon, silicon containing materials and certain metals.

Substrate 12, has disposed on an upper surface 13, a carbon layer 14. It is disclosed that carbon layer 14 is formed of a carbon material which is disposed on surface 13 of substrate 12, using typical semiconductor deposition techniques. More specifically, carbon layer 14 is deposited on surface 13 of substrate 12 using plasma enhanced chemical vapor deposition (PECVD) or sputtering. It should be understood that carbon layer 14 when deposited utilizing plasma enhanced chemical vapor deposition (PECVD) techniques may be nitrogen doped. Carbon layer 14 provides for enhanced adhesion between substrate 12 and a photoresist (discussed presently).

Carbon layer 14 is disclosed as formed of a thin layer of amorphous carbon. Carbon layer 14 in this preferred embodiment is deposited at a thickness of less than 100 Å, preferably with a thickness of 30–70 Å, using standard PECVD techniques or sputtering, well known in the industry. This deposition of carbon layer 14 results in an improved adhesive durability of a subsequently deposited photoresist, to substrate 12, and more particularly in this particular embodiment, to the InGaAs epi coated wafer.

Figure 2:
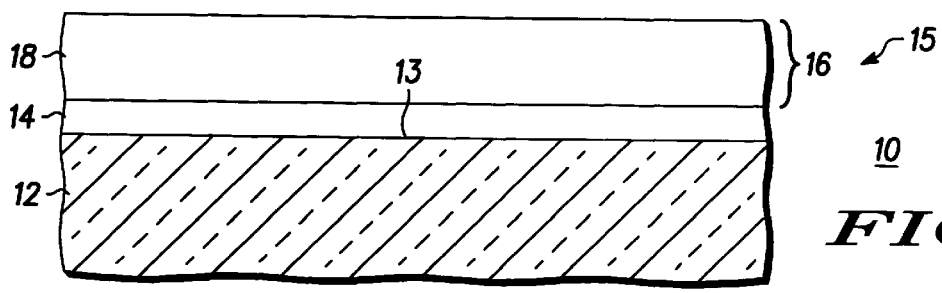
Figure 3:
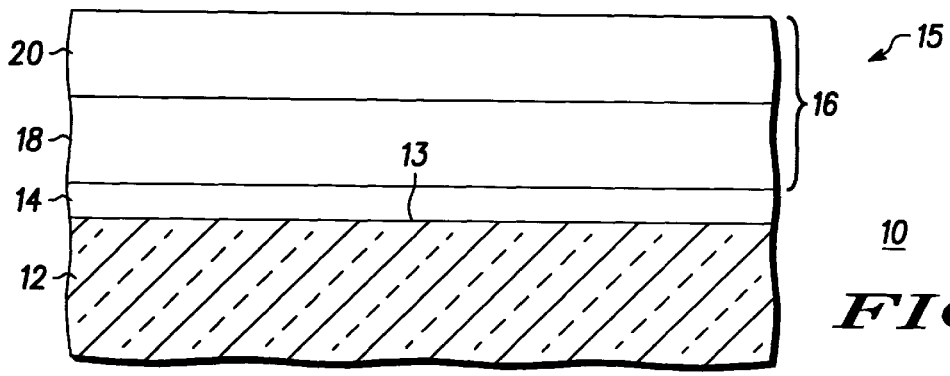

Referring now to FIGS. 2 and 3, the wafer stack, generally referenced 15, is next coated with an organic photoresist stack 16. Photoresist stack 16 may consist of one or more layers of photo-imageable organic photoresist layers, including those materials that are optically and/or electron beam sensitive. As illustrated in FIG. 2, organic photoresist stack 16 is formed as a standard single layer resist, including photoresist layer 18. As illustrated in FIG. 3, in the alternative, organic photoresist stack 16 is formed as a multi-layer resist, such as a standard bilayer resist, including photoresist layers 18 and 20. It should be understood, that resist stack 16, irrespective of being formed as a single resist stack, or a multi-layer resist stack, can be formed to include either a positive resist or a negative resist, dependent upon the desired pattern.

Figure 4:
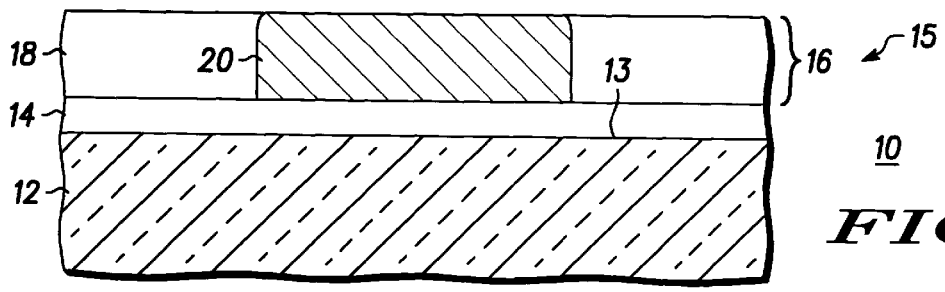

As illustrated in FIG. 4, wafer stack 15, and more specifically, resist stack 16, is next developed and patterned using standard lithographic methods, such as electron beam, optical, or the like. As illustrated, an area 20 of stack 16 is removed during the development process, thereby forming the pattern.

Next, the completely developed wafer stack 15 is etched for approximately one minute in an oxygen plasma to remove a portion of carbon 14 exposed during the patterning steps and provide for subsequent metallization steps. Stack 15 is then soaked in a 10% $NH_4OH$ solution for a duration of typically 1 to 5 minutes. The soaking of stack 15 in the $NH_4OH$ solution provides for the cleaning of the exposed surface prior to metallization. The criteria for measuring adhesive strength and durability is a ten minute soak in 10% ammonium hydroxide ($NH_4OH$) aqueous solution at room temperature. During this immersion time, no lifting or undercutting of even the smallest, typically sub-micron, features should occur.

Typically carbon layer 14 is deposited in approximately 15 seconds and is easily removed by low/zero bias oxygen plasma. More particularly, the patterned stack 15 is de-scummed immediately following patterning, and prior to subsequent processing. Following the next desired processes, resist layer 16 and carbon layer 14 are removed. This step of removal may be done by techniques including wet chemical dissolution or oxygen plasma ashing. Samples of patterned wafers using a carbon layer and either a single or bilayer resist stack as disclosed herein, were developed for 1 minute and immersed in a 10% ammonium hydroxide solution for 10 minutes. Examination of the patterned resist using a scanning electron microscope (SEM) microscope revealed that the resist did not lift nor did its profile show any signs of delamination or undercutting. As a result it is concluded that the inclusion of carbon layer 14 results in surface 13 of substrate 12 being well suited for adhesion of photoresist 16.

It is anticipated by this disclosure that carbon layer 14 is formed of an amorphous carbon, deposited on surface 13 of substrate 12 at a thickness of less than 100 Å. As previously described in the preferred embodiment, carbon layer 14 is formed at a thickness of between 30–70 Å. Two types of amorphous carbon are disclosed as suitable for fabrication of carbon layer 14. More particularly a polymer-like carbon material and a diamond-like carbon (DLC) material, are disclosed for carbon layer 14. In a preferred embodiment, polymer-like carbon material is described as being ~60% polymeric, having a low density value of ~0.9 g/cc, a hardness value of ~2.0 GPa and optical constant data of n~1.7 and k~0.02. Diamond-like carbon material is described as being 35% polymeric, having a higher density value of ~1.4 g/cc, a hardness value of ~8.0 GPa, and optical constant data of n~1.9 and k~0.20. Carbon layer 14 provides for enhanced adhesion of photoresist stack 16 to the surface 13 of substrate 12 by altering the surface energy of substrate 12, so as to provide greater compatibility with photoresist stack 16, while simultaneously repelling water or aqueous mixtures.

Thus, an carbon layer for improved adhesion of photoresist and method of fabrication is disclosed. The inclusion of a carbon layer provides for enhanced adhesion of a resist layer to a wafer surface. This enhancement of the adhesion properties provides for improved fabrication of semiconductor devices, including the ease with which removal of resist layers is achieved.

What is claimed is:

1. A method of forming a semiconductor device including enhanced photoresist adhesion comprising the steps of:
    providing a substrate having an uppermost surface;
    depositing a single layer of carbon on the uppermost surface of the substrate; and
    forming a resist stack on an uppermost surface of the single layer of carbon.

2. A method of forming a semiconductor device including enhanced photoresist adhesion as claimed in claim 1 wherein the step of providing a substrate having an uppermost surface includes providing a substrate formed of a III–V material.

3. A method of forming a semiconductor device including enhanced photoresist adhesion as claimed in claim 2 wherein the step of providing a substrate having an uppermost surface includes providing a substrate formed of InGaAs.

4. A method of forming a semiconductor device including enhanced photoresist adhesion as claimed in claim 2 wherein the step of providing a substrate having an uppermost surface includes providing a substrate formed of InAlAs.

5. A method of forming a semiconductor device including enhanced photoresist adhesion as claimed in claim 2 wherein the step of providing a substrate having an uppermost surface includes providing a substrate formed of GaAs.

6. A method of forming a semiconductor device including enhanced photoresist adhesion as claimed in claim 1 wherein the step of depositing a single layer of carbon includes plasma enhanced chemical vapor deposition (PECVD).

7. A method of forming a semiconductor device including enhanced photoresist adhesion as claimed in claim 1 wherein the step of depositing a single layer of carbon includes sputtering.

8. A method of forming a semiconductor device including enhanced photoresist adhesion as claimed in claim 1 wherein the step of depositing a single layer of carbon includes depositing a polymer-like carbon material.

9. A method of forming a semiconductor device including enhanced photoresist adhesion as claimed in claim 1 wherein the step of depositing a single layer of carbon includes depositing a diamond-like carbon material.

10. A method of forming a semiconductor device including enhanced photoresist adhesion as claimed in claim 1 wherein the step of forming a resist stack on an uppermost surface of the single layer of carbon includes forming a multi-layer resist stack.

* * * * *